(12) United States Patent
Gu et al.

(10) Patent No.: US 11,018,328 B2
(45) Date of Patent: May 25, 2021

(54) METHOD AND APPARATUS FOR MANUFACTURING DISPLAY SUBSTRATE

(71) Applicant: BOE TECHNOLOGY GROUP CO., LTD., Beijing (CN)

(72) Inventors: Penghao Gu, Beijing (CN); Chunyan Xie, Beijing (CN); Wei Wang, Beijing (CN); Paoming Tsai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/512,695

(22) Filed: Jul. 16, 2019

(65) Prior Publication Data
US 2020/0075898 A1    Mar. 5, 2020

(30) Foreign Application Priority Data

Aug. 31, 2018  (CN) .......................... 201811013215.1

(51) Int. Cl.
*H01L 51/56* (2006.01)
*H01L 27/32* (2006.01)
(Continued)

(52) U.S. Cl.
CPC .............. *H01L 51/56* (2013.01); *H01L 27/32* (2013.01); *H01L 51/0097* (2013.01); *H01L 51/5237* (2013.01); *H01L 2251/5338* (2013.01)

(58) Field of Classification Search
CPC ............. H01L 51/0097; H01L 51/5237; H01L 51/003; H01L 51/56; H01L 27/32; H01L 2251/566; H01L 2251/5338; Y02E 10/549
See application file for complete search history.

(56) References Cited

U.S. PATENT DOCUMENTS 9,508,943 B2 * 11/2016 Lee .................... H01L 51/0097
9,583,732 B2 *  2/2017 Lee .................... H01L 27/3244
(Continued)

FOREIGN PATENT DOCUMENTS

CN        106910428 A    6/2017
CN        107819072 A    3/2018

OTHER PUBLICATIONS

First Office Action dated Mar. 24, 2020 for application No. CN201811013215.1 with English translation attached.

*Primary Examiner* — Michael M Trinh
(74) *Attorney, Agent, or Firm* — Nath, Goldberg & Meyer; Joshua B. Goldberg (57) ABSTRACT

A method and an apparatus for manufacturing a display substrate are provided. The method includes: a back film material forming step of forming a back film material having first adhesion on a substrate, the substrate includes a substrate region and a peripheral region surrounding the substrate region, and the substrate region includes a display region, a bending region, and a bonding region sequentially arranged in a first direction; a back film cutting step of cutting the back film material along outlines of the display region and the bonding region; a back film removing step of removing the back film material in the peripheral region and the bending region; and a back film adhesion enhancing step of enhancing adhesion of the back film material in the display region and the bonding region from the first adhesion to second adhesion, so as to form a back film on the substrate.

11 Claims, 4 Drawing Sheets

(51) Int. Cl.
  *H01L 51/00* (2006.01)
  *H01L 51/52* (2006.01)

(56) References Cited

U.S. PATENT DOCUMENTS

| | | | |
|---|---|---|---|
| 10,177,327 B2 | 1/2019 | Jung et al. | |
| 2010/0243140 A1 | 9/2010 | Sloan | |
| 2017/0194579 A1* | 7/2017 | Wang | H01L 51/0024 |
| 2018/0062026 A1* | 3/2018 | Toribatake | H01L 33/0095 |
| 2018/0076400 A1* | 3/2018 | Jung | B32B 17/064 |
| 2018/0226617 A1* | 8/2018 | Nakagawa | H01L 51/5256 |
| 2019/0386066 A1* | 12/2019 | Cai | H01L 21/77 |

* cited by examiner

METHOD AND APPARATUS FOR MANUFACTURING DISPLAY SUBSTRATE

CROSS-REFERENCE TO RELATED APPLICATIONS

The present disclosure claims the benefit of priority to Chinese Patent Application No. 201811013215.1, filed on Aug. 31, 2018, the contents of which are incorporated herein by reference in their entirety.

TECHNICAL FIELD

The present disclosure relates to the field of display technology, and in particular, to a method for manufacturing a display substrate and an apparatus for manufacturing a display substrate.

BACKGROUND

With the development of the display industry, OLEDs (Organic Light-Emitting Diodes), as a new type of light-emitting device, have been widely studied and applied to the field of display technology. OLEDs are suitable for the flexible display and have a broad development prospect, since the OLED displayers have advantages, such as smaller thickness, a bendable screen, and all narrow bezels of the screen, etc.

SUMMARY

According to an aspect of the present disclosure, a method for manufacturing a display substrate is provided. The method includes: a back film material forming step, a back film cutting step, a back film removing step, and a back film adhesion enhancing step. The back film material forming step includes forming a back film material having first adhesion on a substrate. The substrate includes a substrate region and a peripheral region surrounding the substrate region, and the substrate region includes a display region, a bending region, and a bonding region sequentially arranged in a first direction. The back film cutting step includes cutting the back film material along outlines of the display region and the bonding region. The back film removing step includes removing the back film material in the peripheral region and the bending region. The back film adhesion enhancing step includes enhancing adhesion of the back film material in the display region and the bonding region from the first adhesion to second adhesion, so as to form a back film on the substrate.

In an embodiment, the back film adhesion enhancing step is performed after the back film cutting step and the back film removing step.

In an embodiment, the back film adhesion enhancing step further includes performing an exposure process or a heat process on the back film material in the display region and the bonding region, such that the adhesion of the back film material in the display region and the bonding region is increased or enhanced from the first adhesion to the second adhesion.

In an embodiment, the back film cutting step and the back film removing step are performed after the back film adhesion enhancing step.

In an embodiment, the back film adhesion enhancing step further includes performing an exposure process on the back film material in the display region and the bonding region, such that the adhesion of the back film material in the display region and the bonding region is enhanced from the first adhesion to the second adhesion.

In an embodiment, the performing an exposure process on the back film material in the display region and the bonding region includes: placing a mask plate over the back film material, and exposing the back film material with the mask plate. A hollowed-out region of the mask plate corresponds to the display region and the bonding region.

In an embodiment, the substrate includes a plurality of substrate regions arranged along the first direction; and each of the plurality of substrate regions includes a plurality of substrate sub-regions arranged in a second direction different from the first direction. The back film removing step further includes simultaneously removing the back film material in the peripheral region and the bending regions of the plurality of substrate regions.

In an embodiment, the back film removing step further includes adhering and removing the back film material in the peripheral region and bending region with a tape.

In an embodiment, the back film material includes a base material of the back film and an adhesive material of the back film. The base material of the back film is adhered to the substrate with the adhesive material of the back film. For example, the adhesive material of the back film includes photosensitive resin.

In an embodiment, a value of the first adhesion is in a range of about 1 gf/Inch to 10 gf/Inch, and a value of the second adhesion is larger than about 1000 gf/Inch.

According to an aspect of the present disclosure, an apparatus for manufacturing a display substrate is provided. The apparatus includes: a back film material forming device, a back film cutting device, a back film removing device, and a back film adhesion enhancing device. The back film material forming device is configured for forming a back film material having first adhesion on a substrate. The substrate includes a substrate region and a peripheral region surrounding the substrate region, and the substrate region includes a display region, a bending region, and a bonding region sequentially arranged in a first direction. The back film cutting device is configured for cutting the back film material along outlines of the display region and the bonding region. The back film removing device configured for removing the back film material in the peripheral region and the bending region. The back film adhesion enhancing device is configured for enhancing adhesion of the back film material in the display region and the bonding region from the first adhesion to second adhesion, so as to form a back film on the substrate.

In an embodiment, the back film adhesion enhancing device is further configured for performing an exposure process or a heat process on the back film material in the display region and the bonding region, such that the adhesion of the back film material in the display region and the bonding region is enhanced from the first adhesion to the second adhesion.

In an embodiment, the substrate includes a plurality of substrate regions arranged along the first direction; and each of the plurality of substrate regions includes a plurality of substrate sub-regions arranged in a second direction different from the first direction. The back film removing device is further configured for simultaneously removing the back film material in the peripheral region and the bending regions of the plurality of substrate regions.

In an embodiment, the back film removing device further includes a tape. The back film removing device is further configured for adhering and removing the back film material in the peripheral region and bending region with the tape.

DETAILED DESCRIPTION

In order to enable those skilled in the art to better understand the technical solutions of the present disclosure, the present disclosure will be further described in detail below in conjunction with the drawings and specific embodiments.

In the related art, a narrow lower bezel is realized by bending a driving circuit to a back surface of a substrate, which needs to remove the back film in a bending region. Since the adhesion between the back film and the substrate is larger and the bending region is narrow, it is difficult to peel off the back film in the bending region. The removing of the back film in the bending region is usually achieved by the following two methods: the first method is to burn the back film in the bending region with a laser; the second method is to adhere a grooved back film to the back surface of the substrate. Since it is difficult to control a slope of the laser ablation, the removing effect is uncontrollable. Further, the adhesion process of the grooved back film is costly. Both of the methods are less efficient.

Figure 4:
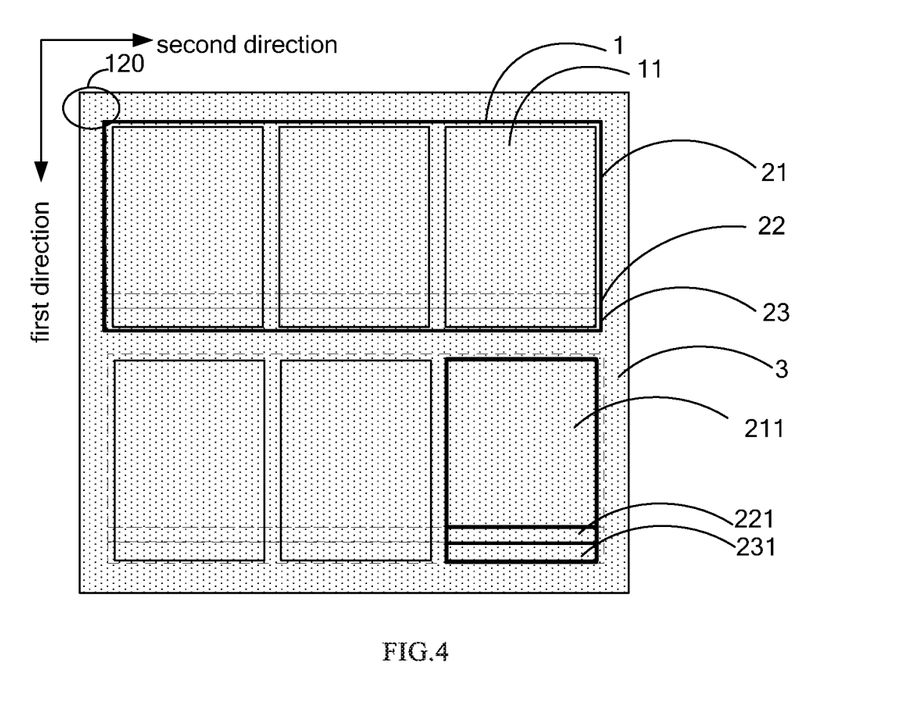
FIG. 4 is a schematic diagram showing a non-display side of a display motherboard according to an embodiment of the present disclosure.
Figure 5:
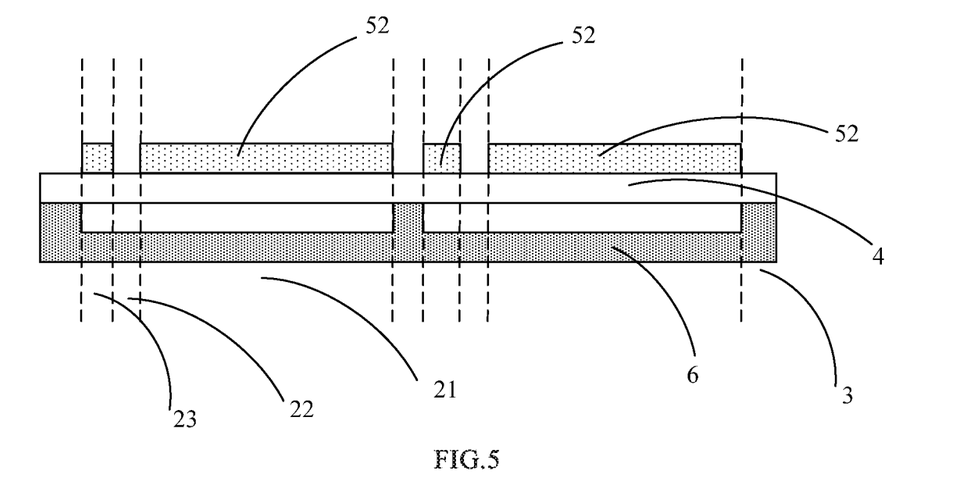
FIG. 5 is a schematic diagram showing a structure of a display motherboard after a back film material in a bending region is removed according to an embodiment of the present disclosure.

The display substrates are obtained by cutting a display motherboard along cutting lines on the display motherboard. The display motherboard has at least one substrate region 1 and a peripheral region 3. The substrate region 1 may include a plurality of substrate sub-regions 11. A region where one display substrate is located is defined as one substrate sub-region 11. In an embodiment, the substrate region 1 may include substrate sub-regions 11 arranged in rows and columns, as shown in FIG. 4 and FIG. 5. In an embodiment, the substrate region 1 may include only one substrate sub-region 11. In an embodiment, the substrate region 1 may include a row or a column of substrate sub-regions 11.

The substrate region 1 includes a display region 21, a bending region 22, and a bonding region 23 arranged from top to bottom (in a first direction) in a top view as shown in FIG. 4. Each of the substrate sub-regions 11 includes a display sub-region 211, a bending sub-region 221 and a bonding sub-region 231 arranged from top to bottom (in the first direction) in a top view as shown in FIG. 4. Display devices (e.g., OLED devices) are provided in the display sub-regions 211, respectively, and driving devices (e.g., driving circuits) are provided in the bonding sub-regions 231, respectively. The bonding sub-region 231 is adhered on a non-light-exiting side of the display sub-region 211 by bending the bending sub-region 221, thereby reducing a size of a display apparatus that can be seen from a front side.

The display sub-regions 211 of the substrate sub-regions 11 in a same row are formed as one display region 21, the bending sub-regions 221 of the substrate sub-regions 11 in a same row are formed as one bending region 22, and the bonding sub-regions 231 of the substrate sub-regions 11 in a same row are formed as one bonding region 23.

The display devices (e.g., OLED devices) are respectively provided in the display sub-regions 211, and driving devices (e.g., driving circuits) are respectively provided in the bonding sub-regions 231. A temporary protective film (i.e., a top film 6) is provided on a display side of the display substrate, and a back film 52 is provided on a non-display side (i.e., a side of the substrate 4 distal to the display side) of the display substrate. In order to bend the flexible display panel better, the back film 52 is provided only in the display region 21 and the bonding region 23 instead of the bending region 22 as shown in FIG. 5.

Figure 1:
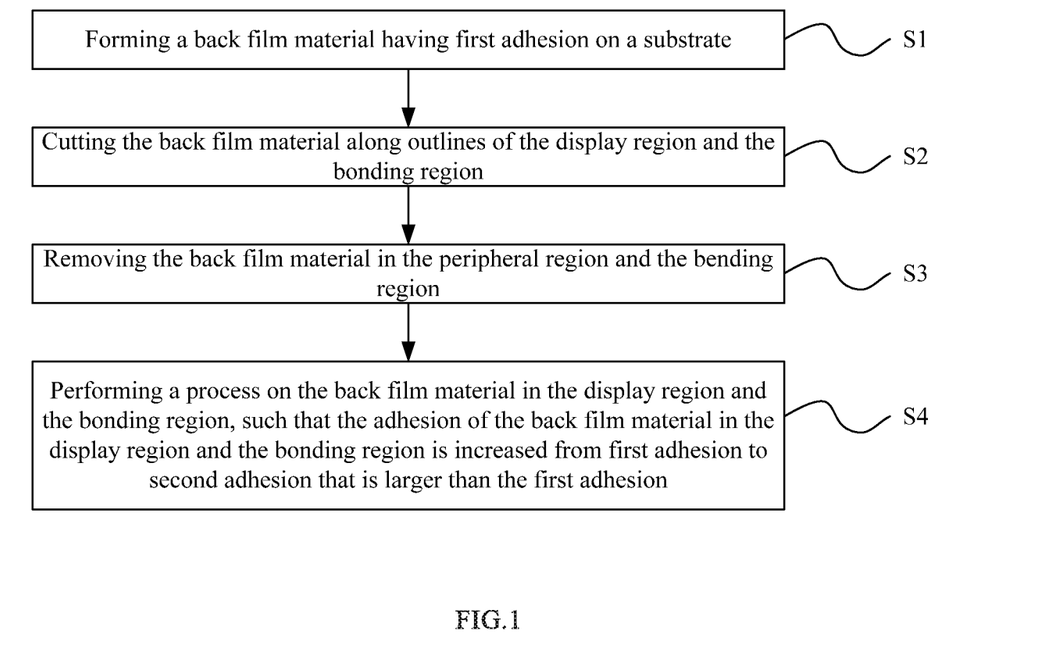
FIG. 1 is a schematic flowchart showing a method for manufacturing a display substrate according to an embodiment of the present disclosure.
Figure 3:
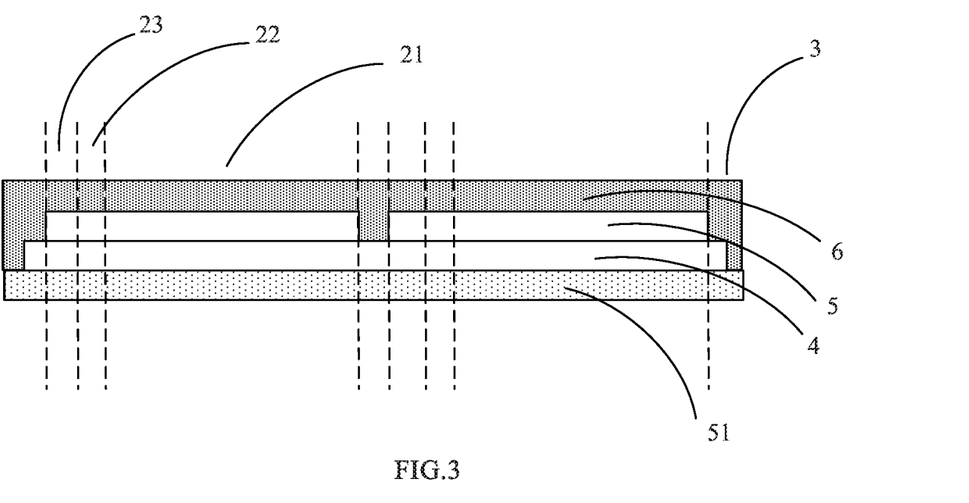
FIG. 3 is a schematic diagram showing a structure of a display motherboard according to an embodiment of the present disclosure.
Figure 7:
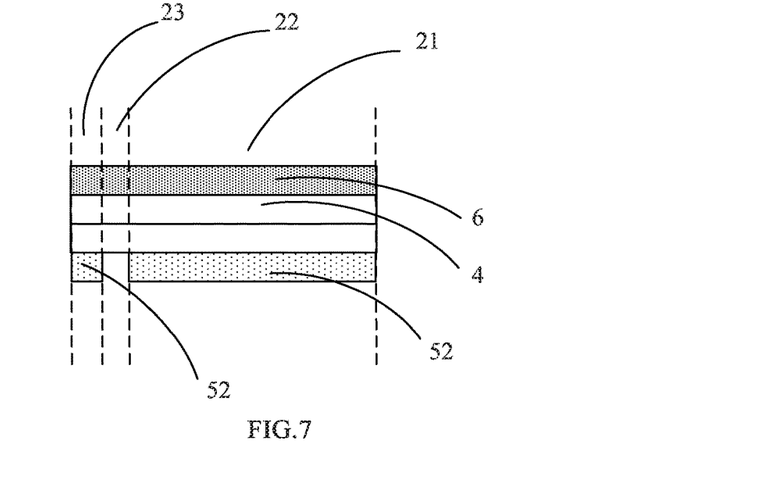
FIG. 7 is a schematic diagram showing a structure of a display substrate according to an embodiment of the present disclosure.

FIG. 1 is a flowchart showing a method for manufacturing a display substrate according to an embodiment of the present disclosure. FIG. 3 is a schematic diagram showing a structure of a display motherboard according to an embodiment of the present disclosure. FIG. 7 is a schematic diagram showing a structure of a display substrate according to an embodiment of the present disclosure. As shown in FIGS. 1, 3 and 7, a method for manufacturing a display substrate is provided in the embodiment, which is particularly suitable for manufacturing a flexible OLED display substrate.

The manufacturing method includes steps S1 to S4.

At step S1, a back film material 51 having first adhesion is formed on a substrate 4.

In an embodiment, the substrate 4 is made of by a flexible material, such as polyimide. Specifically, the back film material 51 having first adhesion is formed on a non-display side of the substrate 4 including a peripheral region 3, a display region 21, a bending region 22, and the bonding region 23. The back film material 51 includes a base material of the back film 52 and an adhesive material of the back film 52. The base material of the back film 52 is adhered to the substrate 4 with by the adhesive material of the back film 52. In the embodiment, the back film material 51 is an adhesion-variable back film material 51, that is, the adhesion of adhesive material of the back film 52 can be enhanced or increased from first adhesion that is smaller to second adhesion that is larger under a certain condition. For example, the adhesive material of the back film 52 may include a photosensitive resin.

In the embodiment, in order to relatively easily remove the back film material 51 in the bending region 22 in the subsequent step, the back film material 51 has an initial adhesion that is smaller (i.e., the first adhesion). For example, the first adhesion has a value of 1 gf/Inch-10 gf/Inch.

In an embodiment, step S1 may further include forming a display device 5 (e.g., an anode, a cathode, a light emitting layer, an encapsulation layer, etc. of the OLED device), a driving device, a temporary protective film (a top film 6), and the like on the substrate 4. Detailed description thereof is omitted here.

The method further includes half-cutting the top film 6 on the substrate 4 with a laser after the back film material 51 is formed on the substrate 4, in order to test the performance of the display substrate in the subsequent process.

At step S2, the back film material 51 is cut along the outlines of the display region 21 and the bonding region 23.

As shown in FIG. 3 and FIG. 4, a cutting process is performed on the back film material 51, such that the back film material 51 in the display region 21 is separated from the back film material 51 in the peripheral region 3 and the bending region 22, the back film material 51 in the bonding region 23 is separated from the back film material 51 in the peripheral region 3 and the bending region 22, and the back film material 51 in the bending region 22 and the back film material 51 in the peripheral region 3 form an integral structure. In a case that the substrate 4 includes a plurality of substrate regions 1 (e.g., substrate regions 1 arranged in rows and columns), as shown in FIG. 4, the back film material 51 in the display regions 21 and the back film material 51 in the bonding regions 23 are cut such that they become individual elements, and the back film material 51 in bending regions 22 is integrally formed with the back film material 51 in the peripheral region 3 as an integral structure.

Specifically, a laser cutting process can be utilized. After the laser half-cutting process is performed on the top film 6, the substrate 4 is inverted such that the back film material 51 is located on a side of the substrate 4 distal to a support platform, and then a laser cutting process is performed on the back film material 51. The cutting of the back film material 51 in the display region 21 and the bonding region 23 is achieved by designing a laser cutting route and a cutting depth without affecting other structures on the substrate 4.

Figure 6:
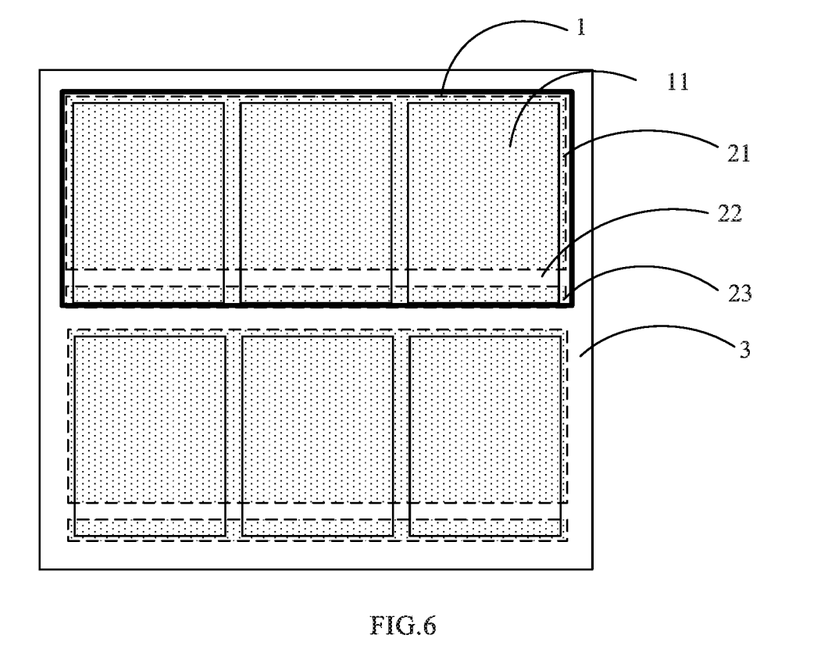
FIG. 6 is a schematic diagram showing a non-display side of a display motherboard after a back film material in a bending region is removed according to an embodiment of the present disclosure.

At step S3, the back film material 51 in the peripheral region 3 and the bending region 22 is removed by a peeling process. As shown in FIGS. 5 and 6, the back film material 51 in the peripheral region 3 and the bending regions 22 is removed at the same time or simultaneously through the peeling process. Since the back film material 51 in the bending regions 22 and the peripheral region 3 always has the first adhesion that is smaller, peeling process is less difficult. Since a width of the bending region 22 is narrow in the practical application, generally only about 2 mm, it is difficult to separately remove the back film material 51 in the bending region 22. Since a size of the back film 52 in the peripheral region 3 is much larger than a size of the back film 52 in the bending region 22, therefore at step S2 when the back film material 51 is cut, the back film material 51 in the bending region 22 and the back film material 51 in the peripheral region 3 are connected together rather than separated from each other, such that the back film 52 in the bending region 22 is peeled off synchronously with the peeling off of the back film 52 in the peripheral region 3, so as to reduce the difficulty in peeling off the back film material 51 in the bending region 22. In the related art, in general, areas of the back film 52 and the top film 6 are larger than an area of the substrate 4. In an embodiment, a top film 6 covers the display device and the substrate 4. In an embodiment, an orthographic projection of the top film 6 on the substrate 4 completely covers the substrate 4.

As shown in FIG. 3, an edge region of the back film material 51 is not connected to the substrate 4, but is directly connected to the top film 6. In an embodiment, an edge of the top film 6 beyond the substrate 4 is in direct contact with the edge of the back film material 51. Since the adhesion between the top film 6 and the back film material 51 is smaller than the adhesion between the substrate 4 and the back film material 51, it is less difficult to peel off the back film material 51 in the bending region 22 and the peripheral region 3 than to directly peel off the back film material 51 in the bending region 22.

Since the adhesion of the back film material 51 in the peripheral region 3 and the bending region 22 is smaller, the back film material 51 in the peripheral region 3 and the bending region 22 may be peeled off by using a removing device in the related art at step S3. Specifically, the back film material 51 in the peripheral region 3 and the bending region 22 may be adhered and removed with a tape, for example, by adhering the tape to a corner 102 of the back film material 51 in the peripheral region 3 and the bending region 22, lifting up the back film material 51 at the corner 102 with the tape, and removing all of the back film material 51 in the peripheral region 3 and the bending region 22 through mechanical grasping, as shown in FIG. 4.

At step S4, the back film material 51 in the display region 21 and the bonding region 23 is processed, such that the adhesion of the back film material 51 in the display region 21 and the bonding region 23 is enhanced from the first adhesion to the second adhesion, so as to form a back film 52 on the substrate 4. The second adhesion is larger than the first adhesion.

In order to ensure the protective effect of the back film material 51 on the display region 21 and the bonding region 23, the back film material 51 in the two regions should have the larger adhesion. Therefore in the embodiment, it is required to process the back film material 51 in the display region 21 and bonding region 23, such that the adhesion of the back film material 51 in the display region 21 and the bonding region 23 is enhanced from the first adhesion to the second adhesion that is larger, thereby finally forming the back film 52 as shown in FIG. 5 in the display region 21 and the bonding region 23 of the substrate 4. For example, the second adhesion is larger than 1000 gf/Inch.

In an embodiment, step S4 may include processing the back film material 51 in the display region 21 and the bonding region 23 through an exposure process (eg, with a UV laser) or a heat process. In an embodiment, the substrate 4 is heated to a temperature of 80° C. and then is maintained at the temperature of 80° C. for 20 minutes. In an embodiment, in the case where the adhesive material of the back film 52 includes a photosensitive resin, the exposure process may be performed on the back film material 51 with UV light having energy of 1000 to 4000 mJ/cm$^2$, for example, 3,000 mJ/cm$^2$, such that the adhesion of the adhesive material of the back film 52 is enhanced to the second adhesion, thereby ensuring the protective effect on the substrate 4.

At last, the substrate 4 on which the back film 52 is formed is cut to form one or more display substrates.

After the back film 52 is formed, the substrate 4 is cut according to the number of display substrates, such that the substrate 4 is cut into a plurality of display substrates each corresponding to the substrate sub-region 11 as shown in FIG. 7. Each display substrate includes one display sub-region 211 one bending sub-region 221 and one bonding region 231. The cutting process in this step can be performed using a laser cutting process.

So far, the manufacturing of the display substrate is completed.

In the method for manufacturing a display substrate according to the embodiment, the adhesion-variable back film material 51 is used to form the back film 52 on the substrate 4; the back film material 51 in the peripheral region 3 and the bending region 22 is removed in a case that the back film material 51 has initial adhesion that is smaller; and the back film material 51 in the display region 21 and bonding region 23 is processed, such that the adhesion of the back film material 51 is enhanced to the greater adhesion, thereby ensuring the protective effect of the back film 52 on the display substrate. In the manufacturing method, the difficulty in removing of the back film material 51 in the bending region 22 is smaller due to the lower adhesion of the back film material 51 in the peripheral region 3 and the bending region 22. In addition, the back film material 51 in the bending region 22 is peeled off with the help of the back film material 51 in the peripheral region 3, thereby further reducing the difficulty in peeling off the back film material 51 in the bending region 22. In the manufacturing method according to the embodiment, the back film material 51 in the bending regions 22 of display substrates of a display motherboard can be removed at the same time, thereby significantly reducing the workload and significantly improving the production efficiency of the display substrate.

Figure 2:
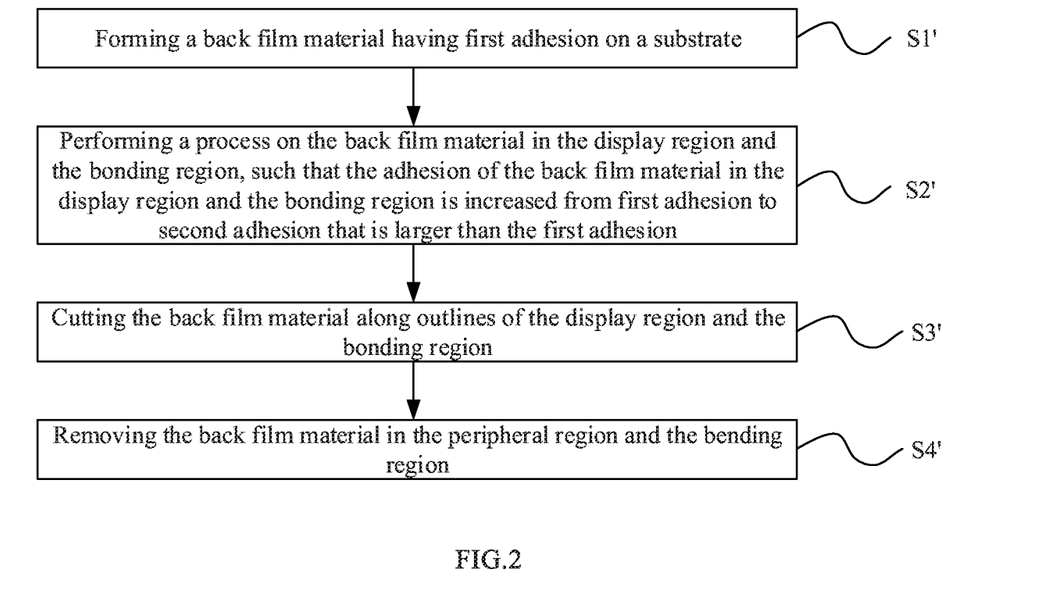
FIG. 2 is a schematic flowchart showing a method for manufacturing a display substrate according to an embodiment of the present disclosure.

FIG. 2 is a schematic flowchart showing a method for manufacturing a display substrate according to an embodiment of the present disclosure. As shown in FIG. 2, a method for manufacturing a display substrate is provided in the embodiment, and is substantially the same as the method for manufacturing the display substrate shown in FIG. 1, and therefore only the differences therebetween are described.

According to the manufacturing method in FIG. 2, at step S2', a back film adhesion enhancing process is performed on the back film material 51 to increase or enhance the adhesion of the back film material 51, and then a back film cutting step S3' and a back film removing step S4' are performed.

Specifically, a process is first performed on the back film material 51 in the display region 21 and the bonding region 23 to enhance the adhesion of the back film material 51 in the display region 21 and the bonding region 23 from the first adhesion to the second adhesion (step S2'); and then a cutting process is performed on the back film material 51 along the outlines of the display region 21 and the bonding region 23 (step S3'). The back film material 51 in the peripheral region 3 and the bending region 22 is removed through a peeling process (step S4').

Specifically, the back film adhesion enhancing process is performed on the back film material 51 in the display region 21 and the bending region 23, such that the adhesion of the back film material 51 in the display region 21 and the bending region 23 is enhanced from the first adhesion to the second adhesion.

When the step S2' is performed, since the back film material 51 in the peripheral region 3 and the bending region 22 has not removed yet, an exposure process (e.g., with a UV laser) is performed on the back film material 51 in the display region 21 and bonding region 23, in order to prevent the adhesion of the back film material 51 in the peripheral region 3 and/or the bending region 22 from being enhanced to the second adhesion when the adhesion enhancing process is performed on the back film material 51 in the display region 21 and the bending region 23. Specifically, the process on the back film material 51 in the display region 21 and the bonding region 23 may include: first placing a mask plate over the back film material 51, and then exposing the back film material 51 with the mask plate.

Figure 9:
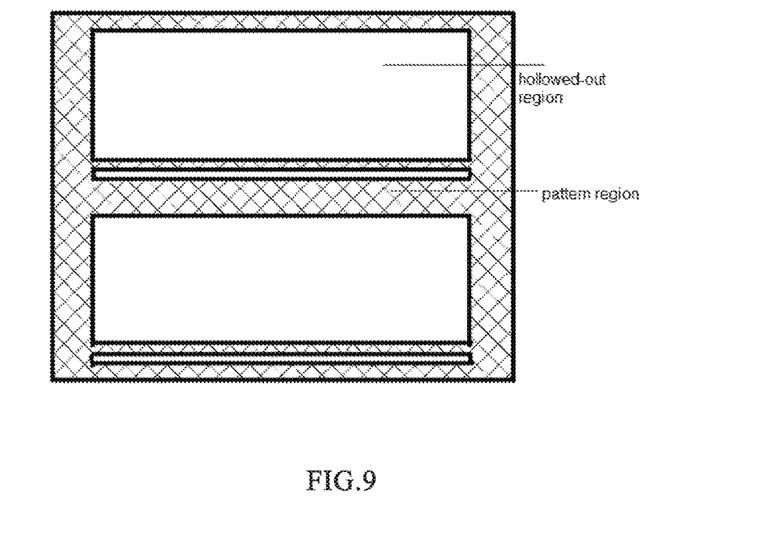
FIG. 9 is a schematic diagram showing a mask plate according to an embodiment of the present disclosure.

FIG. 9 is a schematic diagram showing a mask plate according to an embodiment of the present disclosure. As shown in FIG. 9, a large hollowed-out region and a small hollowed-out region of the mask plate corresponds to the display region 21 and the bonding region 23 of the substrate 4, respectively. The substrate 4 (or the back film material 51) is exposed with the mask plate, such that only the adhesion of the back film material 51 in the display region 21 and the bonding region 23 of the substrate 4 is enhanced from the first adhesion to the second adhesion. Specifically, the mask plate may be a patterned metal mask plate. For example, the mask plate may include a high UV-laser-reflective metal material such as aluminum or molybdenum, and may be formed by metal forming, hot pressing, printing, deposition, or the like.

In the embodiment, when the back film material in the peripheral region and the bending region is peeled off (step S4'), since the adhesion of the back film material in the display region and the bonding region has enhanced to the second adhesion that is larger, the back film material in the display region and the bonding region is adhered to the substrate very well, and may not move or warp due to the peeling process of the back film material in the peripheral region and the bending region, thereby improving the yield of peeling of the back film material. The step of cutting the back film material along outlines of the display region and the bonding region (step S3'), the step of peeling off and removing the back film material in the peripheral region and the bending region (step S4'), the step of cutting the substrate, on which the back film is formed, into one or more display substrate, and the arrangement of the top film 6 can refer to the descriptions of the embodiment shown in FIG. 1, and detailed descriptions thereof are omitted herein.

It is to be noted that in the present embodiment, steps S2' and S3' are interchangeable with each other. That is, the back film cutting step S3' may be performed first, and then the back film adhesion enhancing step S2' may be performed.

Figure 8:
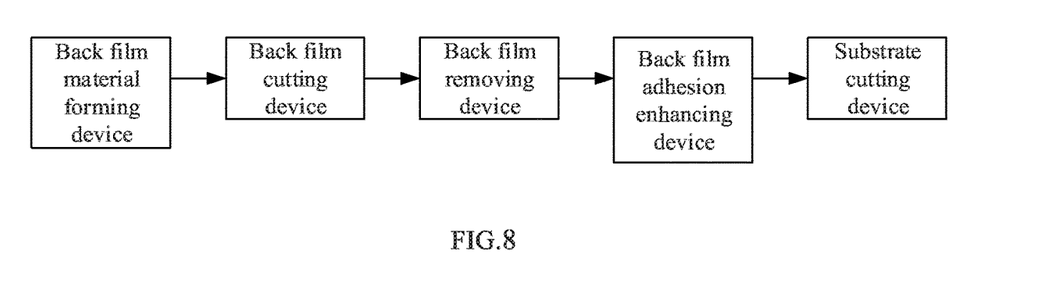
FIG. 8 is a block diagram showing an apparatus for manufacturing a display substrate according to an embodiment of the present disclosure.

FIG. 8 is a block diagram showing an apparatus for manufacturing a display substrate according to an embodiment of the present disclosure. As shown in FIG. 8, an apparatus for manufacturing a display substrate is provided in the embodiment, and it can manufacture the display substrate according to the manufacturing method in the embodiments of the present disclosure.

The apparatus for manufacturing the display substrate includes a back film material forming device, a back film cutting device, a back film removing device, a back film adhesion enhancing device, and a substrate cutting device.

The back film material forming device is configured for forming a back film material having first adhesion on a substrate.

The back film cutting device is configured for cutting the back film material along outlines of the display region and the bonding region, such that the back film material in the display region and the back film material in the peripheral region and the bending region are separated from each other, the back film material in the bonding region and the back film material in the peripheral region and the bending region are separated from each other, and the back film material in the bending region forms an integral structure together with the back film material in the peripheral region. The back film cutting device may include the laser cutting device in the related art.

The back film removing device is configured for removing (e.g., peeling off) the back film material in the peripheral region and the bending region.

The back film adhesion enhancing device is configured for performing a process on the back film material in the display region and the bonding region, such that the adhesion of the back film material in the display region and the bonding region is enhanced from the first adhesion to the second adhesion. The second adhesion is larger than the first adhesion.

The substrate cutting device is configured for cutting the substrate, on which the back film is formed, into one or more display substrates.

The manufacturing apparatus of the display substrate according to the present embodiment further includes a laser half-cutting device configured to perform a half-cut process on the temporary protective film. In addition, the manufacturing apparatus may further include an inverting device configured to invert the substrate after the temporary protective film is half-cut, such that the adhesion enhancing process, the cutting process and the removing process, etc. can be performed on the back film material on the substrate, and to sequentially invert the substrate after the back film material is peeled off, such that the substrate is cut into individual display substrates. It can be understood that the laser cutting device can be applied as the back film cutting device, the substrate cutting device and the laser half-cutting device in this embodiment. Since the three cutting devices described above are not operated at the same time, the back film cutting device, the substrate cutting device, and the laser half-cutting device can utilize a same laser cutting device during the process for manufacturing the display substrate. Different cutting requirements can be realized by controlling the laser cutting parameters, thereby reducing the manufacturing cost of the display substrate.

The manufacturing apparatus of the display substrate according to the embodiment of the present disclosure can manufacture the display substrate according to the manufacturing method in the embodiments of the present disclosure, thereby reducing the difficulty in removing the back film material in the bending region of the display substrate, and improving the production efficiency of the display substrate.

It should be understood that the above embodiments are merely exemplary embodiments for the purpose of illustrating the principle of the disclosure. However, the present disclosure is not limited thereto. It will be apparent to those skilled in the art that various changes and modifications can be made without departing from the spirit and essence of the present disclosure, and the changes and modifications should be regarded as falling within the scope of the present disclosure.

What is claimed is:

1. A method for manufacturing a display substrate, comprising:
    forming a back film material having first adhesion on a substrate, the substrate comprising a substrate region and a peripheral region surrounding the substrate region, and the substrate region comprising a display region, a bending region, and a bonding region sequentially arranged in a first direction;
    cutting the back film material along outlines of the display region and the bonding region;
    removing the back film material in the peripheral region and the bending region; and
    enhancing adhesion of the back film material in the display region and the bonding region from the first adhesion to second adhesion, so as to form a back film on the substrate wherein the substrate comprises a plurality of substrate regions arranged along the first direction;
    each of the plurality of substrate regions comprises a plurality of substrate sub-regions arranged in a second direction different from the first direction, and removing the back film material in the peripheral region and the bending region further comprises simultaneously removing the back film material in the peripheral region and the bending regions of the plurality of substrate regions.

2. The method according to claim 1, wherein
enhancing the adhesion of the back film material in the display region and the bonding region from the first adhesion to the second adhesion is performed after cutting the back film material along the outlines of the display region and the bonding region and removing the back film material in the peripheral region and the bending region.

3. The method according to claim 2, wherein
enhancing the adhesion of the back film material in the display region and the bonding region further comprises performing an exposure process or a heat process on the back film material in the display region and the bonding region, such that the adhesion of the back film material in the display region and the bonding region is enhanced from the first adhesion to the second adhesion.

4. The method according to claim 1, wherein
cutting the back film material along the outlines of the display region and the bonding region and removing the back film material in the peripheral region and the bending region are performed after enhancing the adhesion of the back film material in the display region and the bonding region from the first adhesion to second adhesion.

5. The method according to claim 4, wherein
enhancing the adhesion of the back film material in the display region and the bonding region from the first adhesion to second adhesion further comprises performing an exposure process on the back film material in the display region and the bonding region, such that the adhesion of the back film material in the display region and the bonding region is enhanced from the first adhesion to second adhesion.

6. The method according to claim 5, wherein the performing the exposure process on the back film material in the display region and the bonding region comprises:
    placing a mask plate over the back film material, and exposing the back film material with the mask plate, wherein a hollowed-out region of the mask plate corresponds to the display region and the bonding region.

7. The method according to claim 1, wherein
removing the back film material in the peripheral region and the bending region the further comprises adhering and removing the back film material in the peripheral region and bending region with a tape.

8. The method according to claim 1, wherein
the back film material comprises a base material of the back film and an adhesive material of the back film, and the base material of the back film is adhered to the substrate with the adhesive material of the back film.

9. The method according to claim 8, wherein
the adhesive material of the back film comprises photosensitive resin.

10. The method according to claim 1, wherein
a value of the first adhesion is in a range of about 1 gf/Inch to 10 gf/Inch.

11. The method according to claim 1, wherein
a value of the second adhesion is larger than about 1000 gf/Inch.

* * * * *